(12) United States Patent
Honda et al.

(10) Patent No.: US 7,744,016 B2
(45) Date of Patent: Jun. 29, 2010

(54) ULTRASONIC WASHING APPARATUS

(75) Inventors: Yosuke Honda, Toyohashi (JP); Yuichi Asayama, Toyohashi (JP); Yuichi Maita, Toyohashi (JP); Tomomi Hikita, Toyohashi (JP); Yoshikazu Muramatsu, Toyohashi (JP); Ryoji Kondo, Toyohashi (JP); Haruo Yamamori, Toyohashi (JP); Naoyuki Fujiwara, Toyohashi (JP)

(73) Assignee: Honda Electronics Co., Ltd., Toyohashi-shi, Aichi-ken (JP)

( * ) Notice: Subject to any disclaimer, the term of this patent is extended or adjusted under 35 U.S.C. 154(b) by 1070 days.

(21) Appl. No.: 11/441,270

(22) Filed: May 25, 2006

(65) Prior Publication Data

US 2006/0272685 A1    Dec. 7, 2006

(30) Foreign Application Priority Data

| May 26, 2005 | (JP) | ............................. 2005-153364 |
| Dec. 19, 2005 | (JP) | ............................. 2005-364579 |
| Feb. 10, 2006 | (JP) | ............................. 2006-034190 |
| Feb. 10, 2006 | (JP) | ............................. 2006-034191 |
| Feb. 17, 2006 | (JP) | ............................. 2006-041620 |

(51) Int. Cl.
*B05B 1/08* (2006.01)
*B05B 3/12* (2006.01)

(52) U.S. Cl. .................. 239/102.2; 134/1; 134/184; 134/186

(58) Field of Classification Search .................. None
See application file for complete search history.

(56) References Cited

U.S. PATENT DOCUMENTS

| 4,799,622 | A | * | 1/1989 | Ishikawa et al. | ......... 239/102.2 |
| 4,955,366 | A | * | 9/1990 | Uchiyama et al. | ............... 601/4 |
| 5,529,635 | A | * | 6/1996 | Odell | ............... 134/1 |
| 5,803,099 | A | * | 9/1998 | Sakuta et al. | ............. 134/56 R |
| 5,879,364 | A | * | 3/1999 | Bromfield et al. | ........... 606/169 |
| 6,102,298 | A | * | 8/2000 | Bush et al. | ..................... 239/4 |
| 6,726,631 | B2 | * | 4/2004 | Hatangadi et al. | ........... 600/459 |
| 2004/0126735 | A1 | * | 7/2004 | Hickok et al. | ............... 433/119 |

* cited by examiner

*Primary Examiner*—Michael Barr
*Assistant Examiner*—Jason Y Ko
(74) *Attorney, Agent, or Firm*—Richard M. Goldberg

(57) ABSTRACT

A rod horn of an ultrasonic transmitting medium includes an expanded portion in one end and an inclined plane as a face irradiating ultrasonic waves, an ultrasonic vibrator or vibrators is attached to the expanded portion, the inclined plane of the rod horn is provided by holding a slight gap opposite to a washing body, washing liquid is flowed into the gap in the side of the inclined plane and the washing body is washed by the ultrasonic wave and the washing liquid.

12 Claims, 15 Drawing Sheets

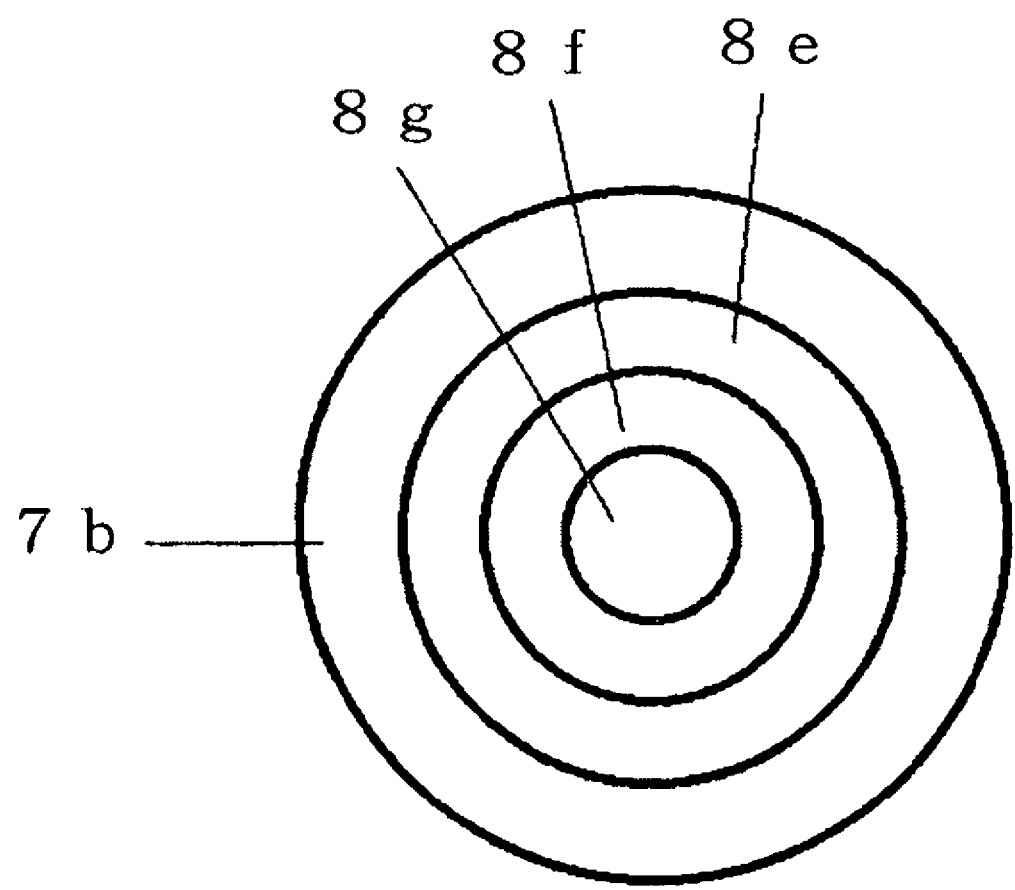

ULTRASONIC WASHING APPARATUS

BACKGROUND OF THE INVENTION

The present invention relates to an ultrasonic washing apparatus in which a flat face or a curved face of a disc is washed by ultrasonic vibration transmitted through a rod horn.

In an ultrasonic disc washing apparatus according to the prior art, a wedge material is formed by a flat face paralleled with a disc to be washed, an upper face formed by a little angle to the flat face and a back face formed between the flat face and the upper face having an angle of 50 to 80 degrees to the flat face. An ultrasonic vibrator connected to an oscillating circuit is attached to the back face of the wedge, and a washing liquid applying device is provided which includes a nozzle for applying a washing liquid.

In the ultrasonic disk washing apparatus in the prior art, the wedge material or the disk to be washed is moved, and the washing liquid is applied by the nozzle between the flat face of the wedge and the face of the disk to be washed. When an oscillating power is applied to the ultrasonic vibrator, ultrasonic waves generated by the ultrasonic vibrator are transmitted from the back face of the wedge materials through the flat face of the wedge material to the washing liquid on the disk to be washed, and the face of the disk to be washed is washed by the washing liquid.

In the above ultrasonic washing apparatus, the ultrasonic vibration generated by the ultrasonic vibrator is transmitted from the back face of the wedge material through the flat face to the washing liquid on the surface of the disk to be washed and the surface of the disk to be washed is washed by the ultrasonic vibration transmitted to the washing liquid, Then, because focusing position (focusing point) of the ultrasonic wave generated by the ultrasonic vibrator is put on the position of the flat face of the wedge material determined by the form of the ultrasonic vibrator and frequencies of the ultrasonic waves, damage is added to minute patterns on a semiconductor by the irradiation of the focused ultrasonic vibration to a semiconductor having a minute pattern and the patterns of the semiconductor are destroyed by the focused ultrasonic vibration.

It is provided that a prior ultrasonic washing apparatus has the edge material forming a perforation hole in the side face. However, in the prior ultrasonic washing apparatus, the formation of the edge material becomes complicated, the washing liquid and contamination are accumulated in the perforation hole and this becomes a cause generating particles marring the disk of the semiconductor.

SUMMARY OF THE INVENTION

It is, therefore, the primary object of the present invention to provide an ultrasonic washing apparatus in which a disk to be washed is not damaged owing to an ultrasonic wave.

It is another object of the present invention to provide an ultrasonic washing apparatus in which ultrasonic waves are not focused at one point but rather are scattered.

In order to accomplish the above and other object, the present invention comprises a rod horn for transmitting ultrasonic vibrations, the rod horn having an inclined plane in one end as a face for irradiating ultrasonic vibration and an expanded portion attached to an ultrasonic vibrator in the other end, a case for covering the ultrasonic vibrator, and a cable connected to the ultrasonic vibrator and drawn out from the end of the case, the inclined plane being provided in parallel with a disk to be washed and in a minute gap between the inclined plane of rod one and the disk to be washed, washing liquid is applied from the side of the inclined plane of the rod horn to the gap of the disk to be washed and the inclined plane of the rod horn and the surface of disk is washed by the washing liquid and the ultrasonic waves.

BRIEF DESCRIPTION OF THE DRAWINGS

FIG. 15 shows a plan view of the other ultrasonic vibrators attached to the rod horn.

DESCRIPTION OF THE PREFERRED EMBODIMENT

Figure 1:
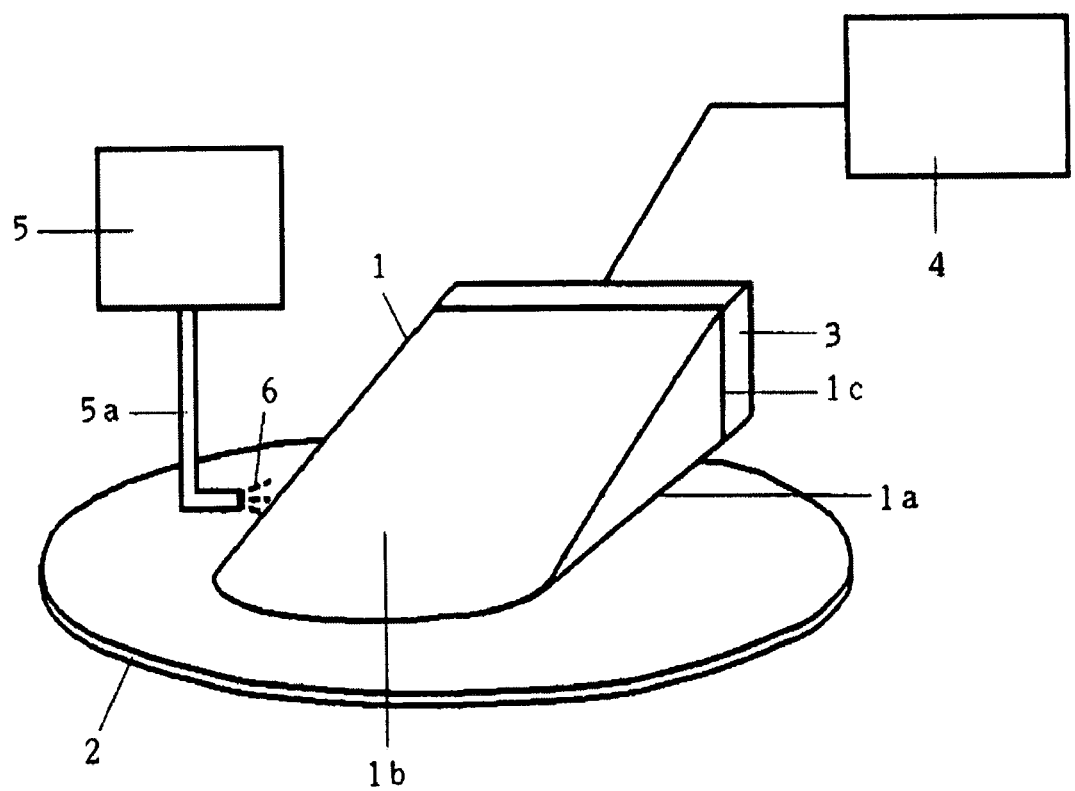
FIG. 1 shows a perspective view of a prior ultrasonic washing apparatus.
Figure 2:
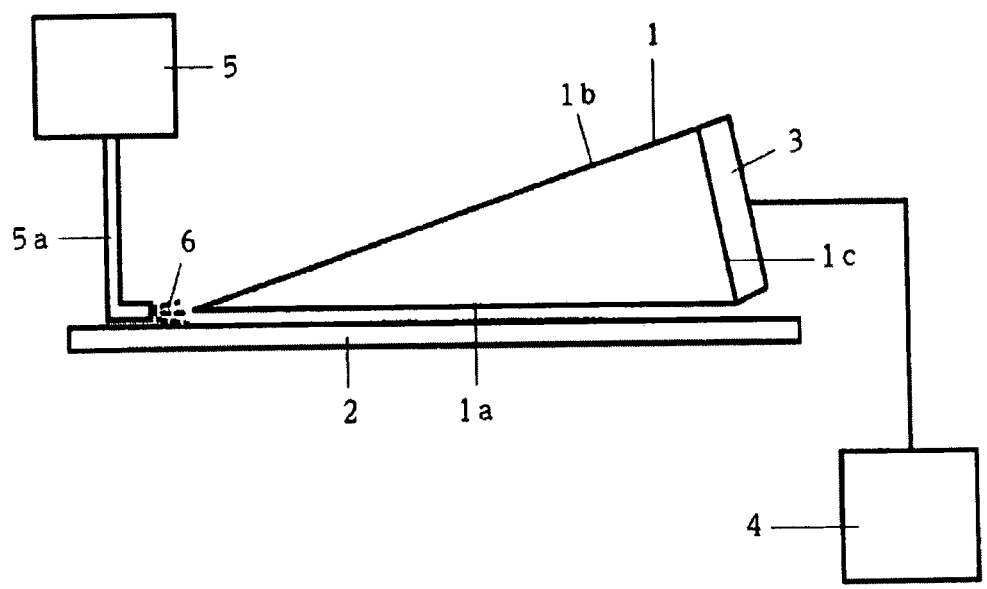
FIG. 2 shows a side view of the prior ultrasonic washing apparatus in FIG. 1.

In a prior ultrasonic disk washing apparatus, as shown in FIG. 1, a flat plane 1a of a wedge material 1 is provided in parallel with a disk 2 to be washed, an upper face 1b formed by a little angle to the flat face 1a and a back face 1c formed between the flat face and upper face having an angle from 50 degrees to 80 degrees, an ultrasonic vibrator 3 connected to an oscillating circuit 4 is attached to the back face 1c of the wedge material 1, and a washing liquid applying device 5 is provided with a nozzle 5a for applying a washing liquid 6.

In the ultrasonic disk washing apparatus in the prior art, the wedge material 1 or the disk 2 to be washed is moved, and the washing liquid 6 is applied by the nozzle 5a between the flat face 1a of the wedge material 1 and the face of the disk 2 to be washed. When an oscillating power is applied to the ultrasonic vibrator 3, ultrasonic waves generated by the ultrasonic vibrator 3 are transmitted from the back face 1c of the wedge material 1 through the flat face 1a of the wedge material 1 to the washing liquid 6 on the disk 2 to be washed, and the surface of the disk 2 to be washed is washed by the washing liquid 6 and the ultrasonic waves.

In the above ultrasonic washing apparatus, the ultrasonic vibration generated by the ultrasonic vibrator 3 is transmitted from the back face 1c of the wedge material 1 through the flat face 1a to the washing liquid on the surface of the disk to be washed and the surface of the disk 2 to be washed is washed by the ultrasonic vibration transmitted to the washing liquid 6, Then, because the focusing position (focusing point) of the ultrasonic wave generated by the ultrasonic vibrator 3 is provided at a the position of the flat face 1a of the wedge material 1 determined by the formation of the ultrasonic vibrator 3 and frequencies of the ultrasonic waves, damage is added to minute patterns on a semiconductor by the irradiation of the focused ultrasonic vibration to a semiconductor having a minute pattern and the patterns of the semiconductor are destroyed by the focused ultrasonic vibration.

It is provided that a prior ultrasonic washing apparatus has the wedge material 1 forming a perforation hole in the side face. However, in the prior ultrasonic washing apparatus, the formation of the wedge material 1 becomes complicated. The washing liquid 6 and contamination are accumulated in the perforation hole and this becomes a cause generating particles marring the disk of the semiconductor.

Figure 3:
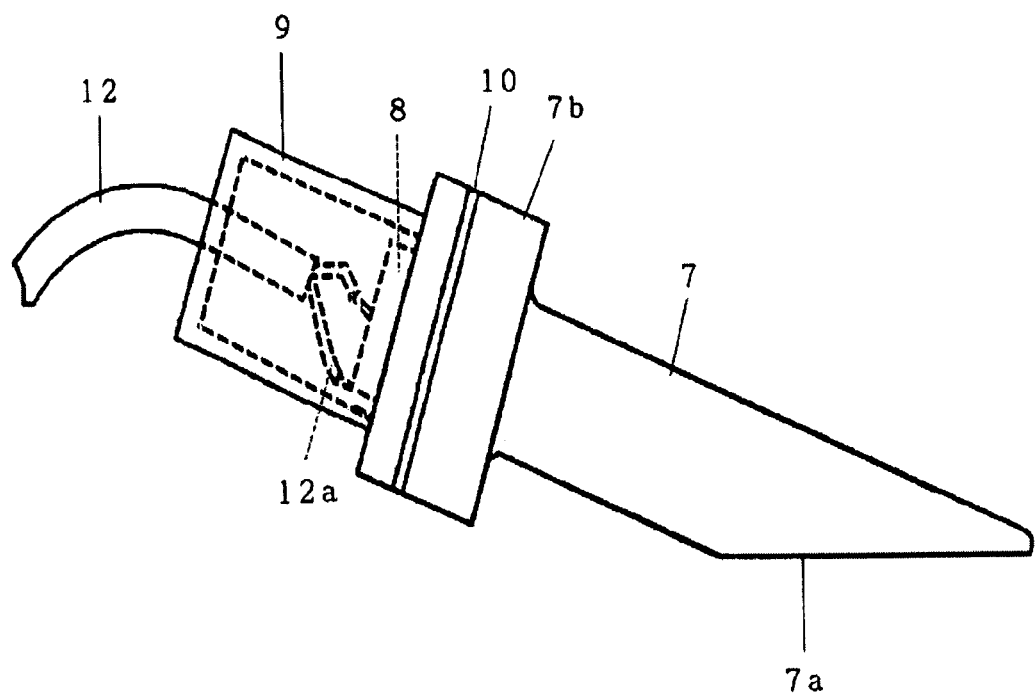
FIG. 3 shows a side view of an ultrasonic washing apparatus according to an embodiment of the present invention.
Figure 4:
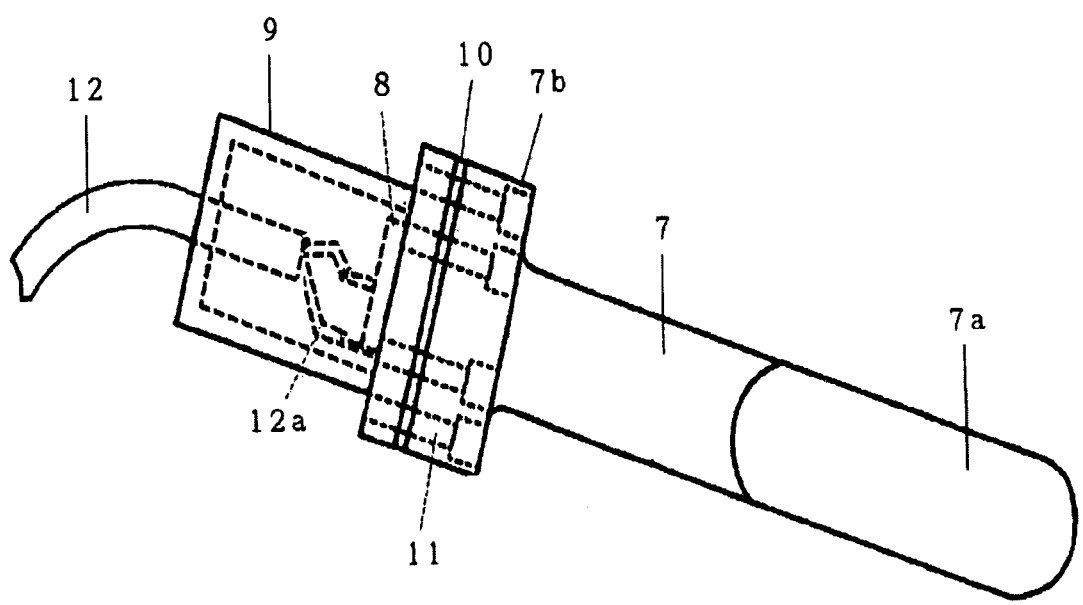
FIG. 4 shows a bottom plan view of the ultrasonic washing apparatus according to the embodiment of FIG. 3 of the present invention.

Referring to FIGS. 3 and 4, one end of a rod horn 7 is cut by an angle and an inclined plane 7a is formed, while an expanded portion 7b is formed at the other end of the rod horn 7. An ultrasonic vibration 8 is attached to the expanded portion 7b of the rod horn 7, while a case 9 for covering the ultrasonic vibrator 8 is fixed to the expanded portion 7b of the rod horn 7 through a packing 10 by a screw 11, a cable 12 is passed through the end of the case 9, and codes 12a of the cable 12 are connected to the ultrasonic vibrator 8.

In the above ultrasonic washing apparatus, the inclined plane 7a of the rod horn 7 is provided opposite to the disk with a minute gap, the washing liquid is inserted into the minute gap between the inclined plane 7a of the rod horn 7 and the disk, and the ultrasonic wave irradiated from the ultrasonic vibrator 8 is transmitted through the washing liquid to the inclined plane 7a of the rod horn 7, so that contamination and dirt adhered on the surface of the disk can be washed.

Then the inclined plane 7a formed at one end of the rod horn 7 can be arranged in a different plane for providing an irradiating ultrasonic wave by a cutting angle of the end of the rod horn 7, and a washing body provided in a narrow gap is washed by forming the rod horn and the nozzle for applying the washing liquid.

Figure 5:
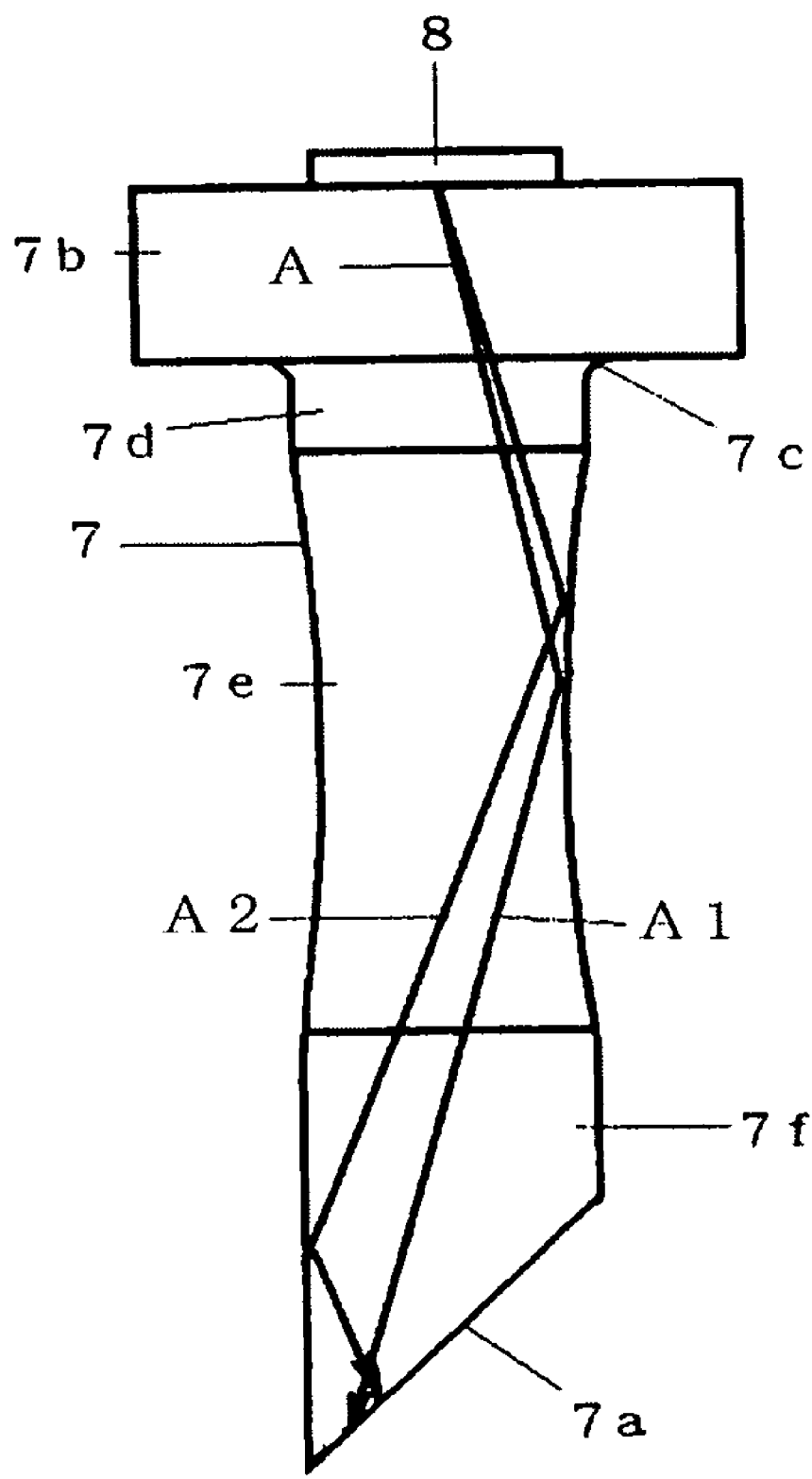
FIG. 5 shows a side view of an ultrasonic washing apparatus according to another embodiment of the present invention.

Referring to FIG. 5, the expanded portion 7b is formed at one end of the rod horn 7, and the ultrasonic vibrator 8 is attached to the expanded portion 7b. A straight portion 7d is formed a small distance from a connected portion 7c at the opposite end of expanded portion 7b. A circular arc portion 7e connected to the straight portion 7d is formed as a narrow portion becoming gradually thin and then becoming gradually thick in a far position from a focusing point of the ultrasonic wave irradiated from the ultrasonic vibrator. A straight portion 7f is connected to the circular arc portion 7e, and the inclined portion 7a is formed in the straight portion 7f.

In the above ultrasonic washing apparatus, one part A1 of ultrasonic waves A irradiated by the ultrasonic vibrator 8 is reflected by the circular arc portion 7e and is directly irradiated on the inclined portion 7a, while the other part A2 of the ultrasonic waves A is reflected by the circular arc portion 7e, is then reflected by the straight portion 7f and is then irradiated on the inclined portion 7a. Therefore, the ultrasonic waves A irradiated by the ultrasonic vibrator 8 are irradiated by not focusing and by scattering, so that the ultrasonic waves irradiated the center of the inclined portion 7a are reduced, uniformity of the ultrasonic waves in the inclined portion improves and any damage is not added to a washing body.

In the ultrasonic washing apparatus in the present embodiment, when the inclined plane 7a of the rod horn 7 is provided opposite to the washing body as a disk in a thin gap, washing liquid is inserted into the thin gap between the inclined plane 7a of the rod horn 7 and the washing body, and oscillating power from an oscillator (not shown) is applied to the ultrasonic vibrator 8. The ultrasonic waves from the ultrasonic vibrator 8 are transmitted to the inclined portion 7a of the rod horn 7 and are irradiated on the washing body from the inclined portion 7a, so that stain and contamination are removed from the washing body.

Figure 6:
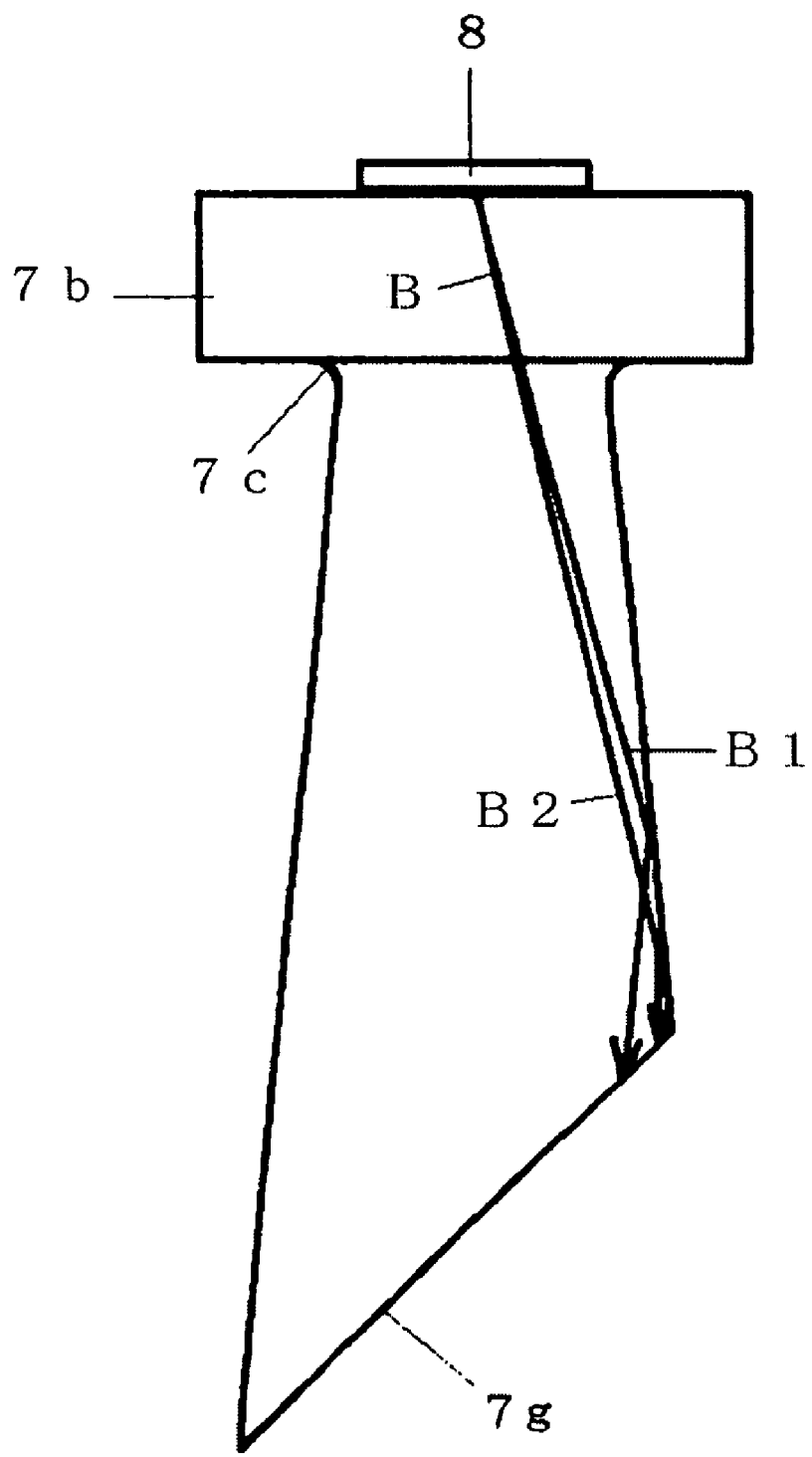
FIG. 6 shows a side view of an ultrasonic washing apparatus according to another embodiment of the present invention.

Referring to FIG. 6, 7b designates an expanded portion of a rod horn, 7c a connected portion, and 8 an ultrasonic vibrator. These constructions are the same as the above embodiment, and a detailed explanation thereof is omitted. In the embodiment, the rod horn 7 is formed to become gradually thick from the connected portion 7c to the end, and an expanded and inclined plane 7g is formed in the end of the rod horn 7.

In the embodiment of the present invention, since ultrasonic waves B from the ultrasonic vibrator 8 are reflected by the portion in which a diameter increases, a part B1 of the ultrasonic waves B is reflected at a portion near to the connected portion 7c and is irradiated the expanded and inclined plane 7g, and the other ultrasonic wave B2 of the ultrasonic waves B is reflected by a portion near to the expanded and inclined plane 7g and is irradiated on the expanded and inclined plane 7g. Thus, the ultrasonic wave B is not focused and is scattered, the ultrasonic waves irradiated at the center of the expanded and inclined plane 7g are reduced, the ultrasonic waves becomes uniform in the expanded and inclined plane 7g and any damage is not added to the washing body.

In the above embodiment, the rod horn is formed with either the circular arc portion 7e having a narrow portion or the expanded and inclined plane 7g in the end of the rod horn. If the circular arc portion 7e and the expanded and inclined plane 7g are formed in the rod hone 7, the ultrasonic waves in the center portion are decreased, the uniformity of the ultrasonic waves in the expanded and inclined plane of the rod hone 7 is improved, and any damage is not added to the washing body.

Figure 7:
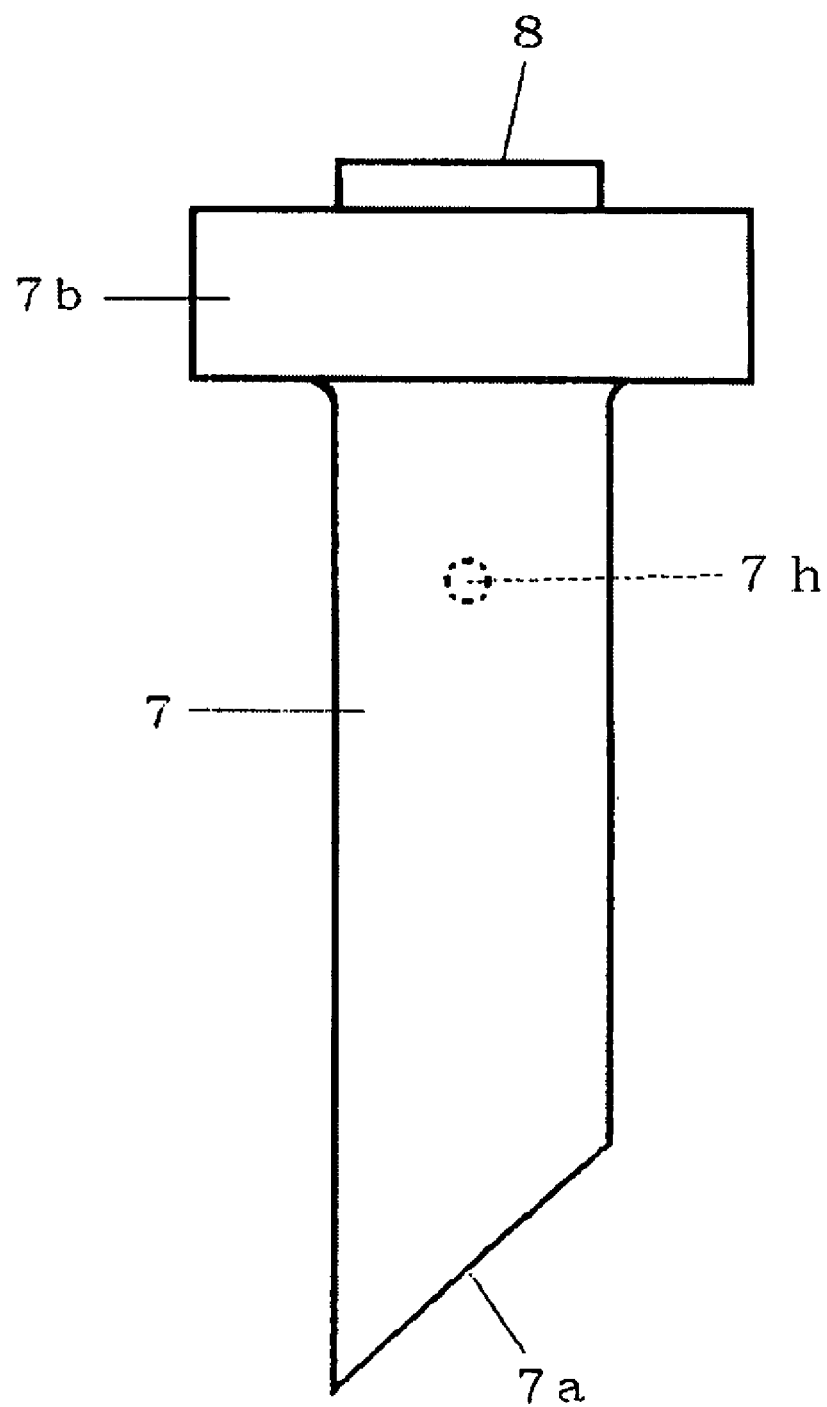
FIG. 7 shows a side view of an ultrasonic washing apparatus according to another embodiment of the present invention.

Referring to FIG. 7, an expanded portion 7b is formed at one end of a rod horn 7, an ultrasonic vibrator is attached to the expanded portion 7b, an inclined plane 7a is formed by obliquely cutting the other end of the rod horn 7 in a far position remote from a focusing point of the ultrasonic wave irradiated by the ultrasonic vibrator 8, and a hollow portion 7h is formed in a position on the center line between the ultrasonic vibrator 8 and the inclined plane 7a in the rod horn 7.

Figure 8:
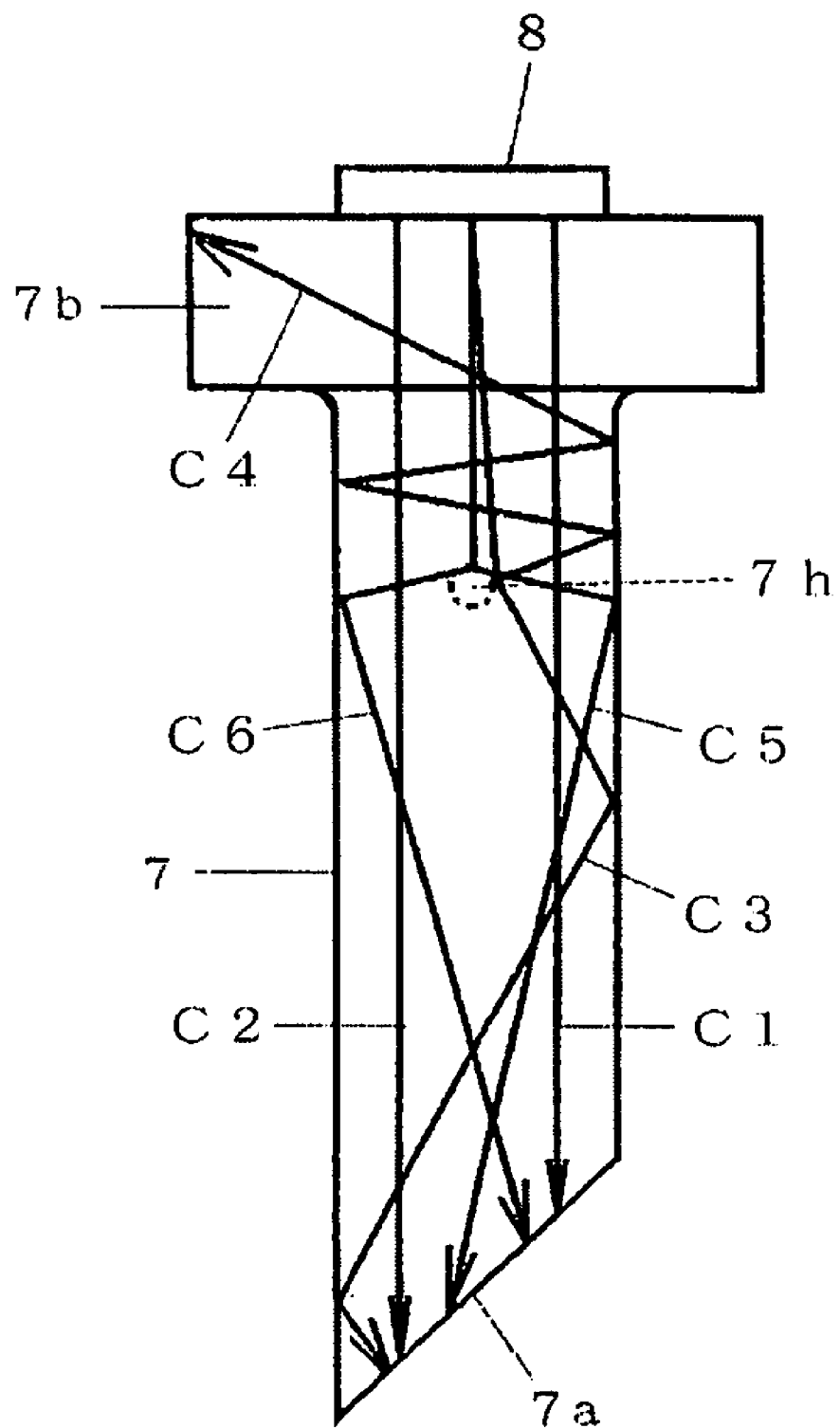
FIG. 8 shows a view of an explanation of a motion of ultrasonic wave transmitted from one ultrasonic vibrator attached to the rod horn of FIG. 7.

In the above ultrasonic washing apparatus, as shown in FIG. 8, ultrasonic waves C1 and C2 emitted by the ultrasonic vibrator 8 remote from the center line of the rod horn 7 are irradiated on the inclined plane 7a, the ultrasonic wave C3 emitted by the ultrasonic vibrator 8 in a position remote slightly from the center line of the rod horn 7 is reflected by the hollow portion 7h and by the side face of the rod horn 7 and is irradiated on the inclined plane 7a, and the ultrasonic waves C5 and C6 emitted in the center portion of the ultrasonic vibrator 8 are reflected by the side of the hollow portion 7h near the center of the hollow portion 7h and are irradiated on the inclined plane 7a. Therefore, since the ultrasonic waves C1 to C6 emitted by the ultrasonic vibrator 8 are dispersedly irradiated on the inclined plane 7a, the ultrasonic waves irradiated at the center of the inclined plane 7a are reduced, uniformity of the ultrasonic wave in the inclined plane 7a is improved, and a damage is not added to a washing body.

In the ultrasonic washing apparatus of the present invention, the inclined plane 7a is provided opposite to the washing body as a disc in a slight gap between the inclined plane 7a and the washing body. When a washing liquid is flowed in the slight gap and a power from an oscillator (not shown) is applied to the ultrasonic vibrator 8, the ultrasonic waves are transmitted to the inclined plane 7a and are irradiated on the washing body through the washing liquid in the slight gap, and therefore contamination and stains are removed from the washing body.

In the above embodiment, the hollow 7h formed on the center line of the rod horn 7 is formed by a sphere or an oval.

Figure 9:
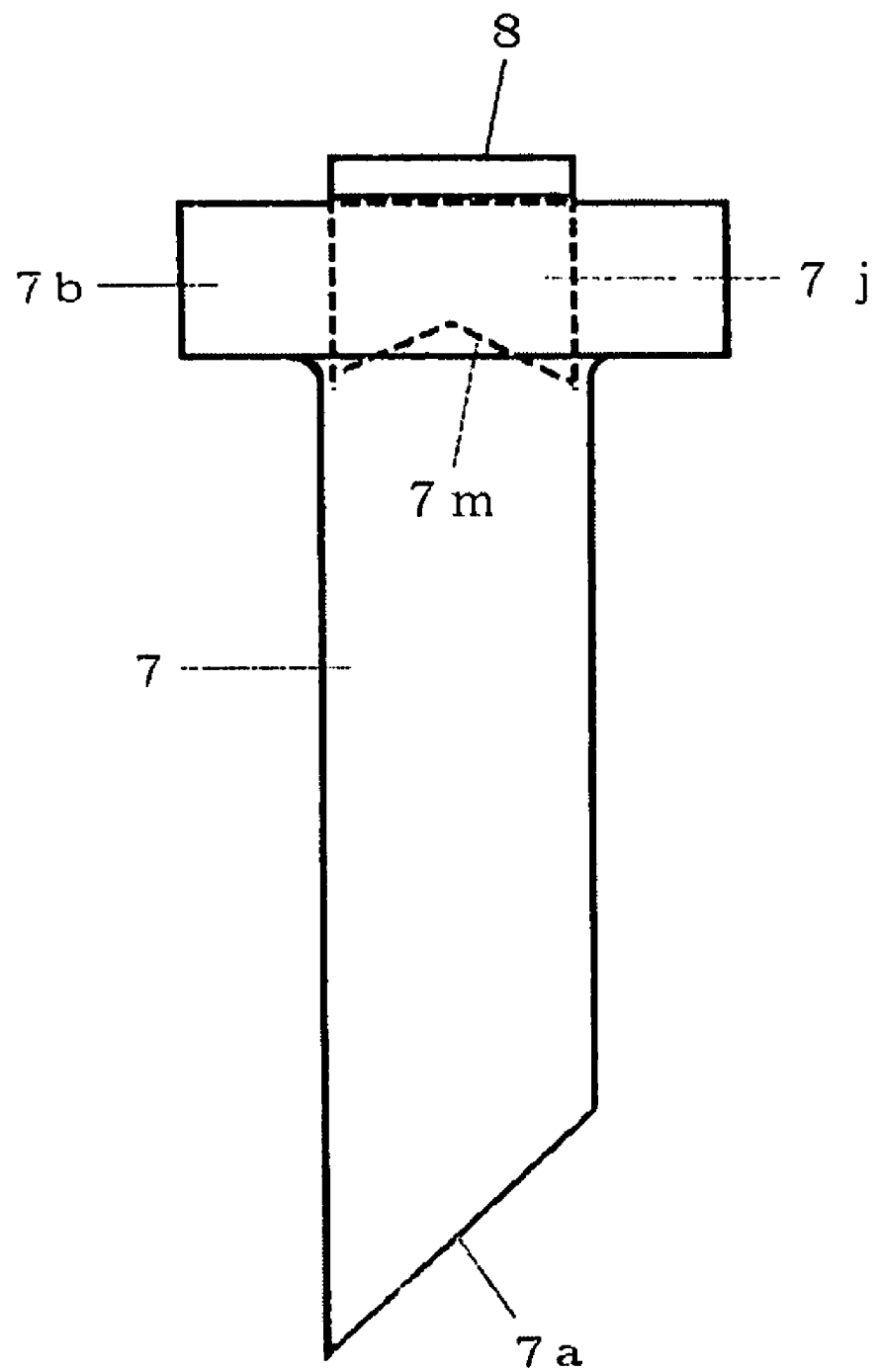
FIG. 9 shows a side view of an ultrasonic washing apparatus according to another embodiment of the present invention.

Referring to FIG. 9, an expanded portion 7b is formed at one end of a rod horn 7, a lens 7j is buried in the expanded portion 7b, the ultrasonic vibrator 8 is attached to the upper end of the expanded portion 7b, and an inclined portion 7a is formed by obliquely cutting the other end of the rod horn 7 in a far position remote from a focusing point of the ultrasonic wave irradiated by the ultrasonic vibrator 8.

Figure 10:
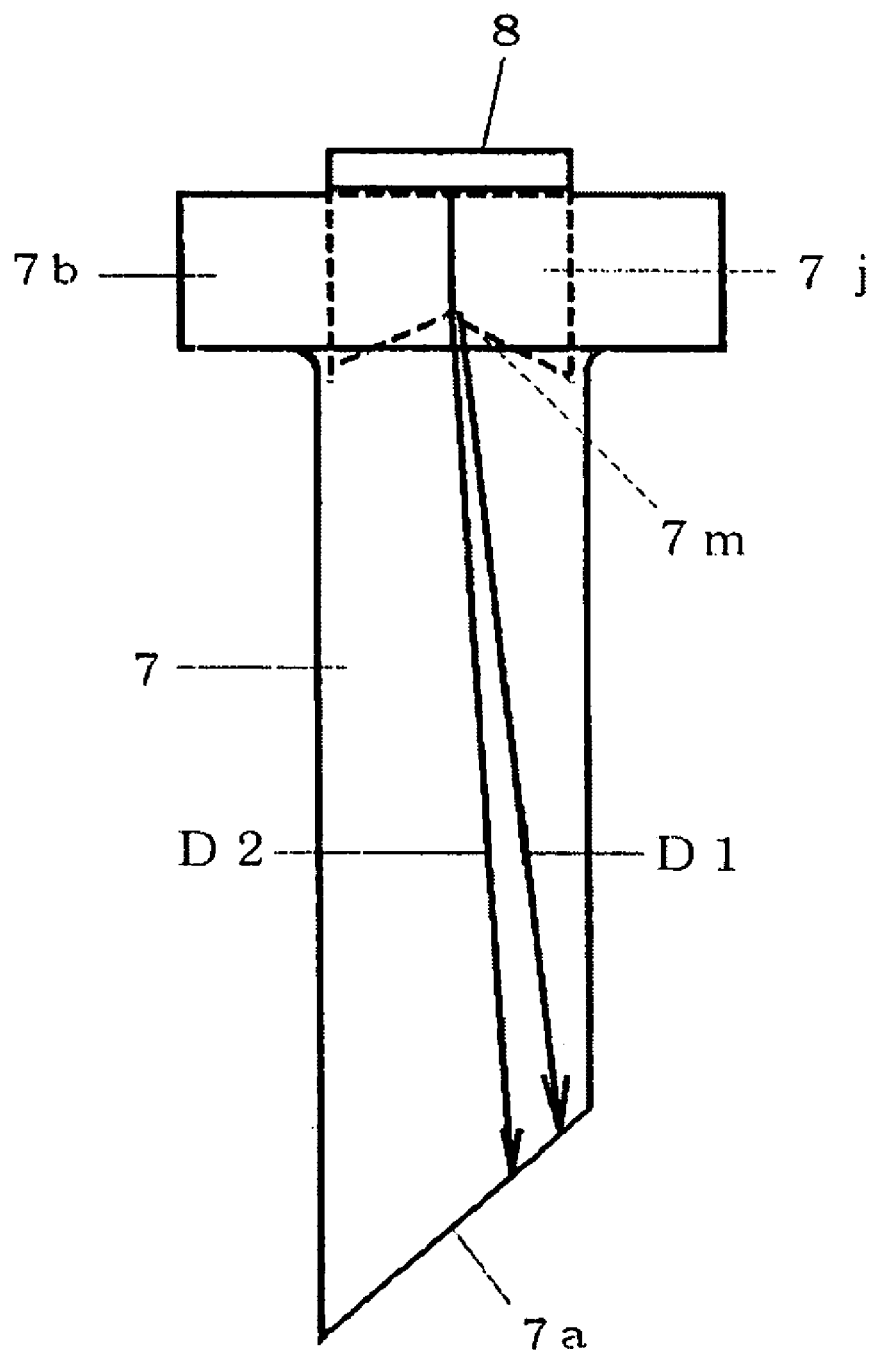
FIG. 10 shows a view of an explanation of a motion of an ultrasonic wave transmitted from one ultrasonic vibrator attached to the rod horn in FIG. 9.

In the above washing apparatus, as shown in FIG. 10, the ultrasonic waves emitted at the center portion of the ultrasonic vibrator 8 are divided into an ultrasonic wave D1 and D2 by the lens 7j and dispersedly irradiated on the inclined plane 7a. Therefore, the ultrasonic waves irradiated in the center portion of the inclined plane 7a are reduced, uniformity of the ultrasonic wave in the inclined plane 7a is improved, and a damage is not added to a washing body.

Then, when a velocity of sound in the lens 7j is L1 and a velocity of sound in rod horn 7 is L2, C1/sin θ1=C2/sin θ2 by Snell's Law of Refraction, a refraction angle from the lens 7j to the rod horn 7 becomes θ2=sin−1(C2/C1×sin θ1). Therefore, when the rod horn 7 as an ultrasonic transmitting medium is quartz, C2=600 meter, lens 7j is a low expansion ceramics and C1=5600 m/s, the velocity of sound of the lens 7j is formed to become smaller than the velocity of sound in the rod horn 7. Therefore, the ultrasonic waves from the ultrasonic vibrator 8 are spread to the outside in the rod horn 7, the ultrasonic waves D1 and D2 are irradiated to the inclined plane 7a by spreading to the outside of the rod horn 7 in the emitting face 7m of the lens 7j.

Therefore, in the ultrasonic washing apparatus, the inclined plane 7a is provided opposite to the washing body as a disc in a slight gap between the inclined plane 7a and the washing body. When a washing liquid is flowed in the slight gap and a power from an oscillator (not shown) is applied to the ultrasonic vibrator 8, the ultrasonic waves are transmitted to the inclined plane 7a and are irradiated on the washing body through the washing liquid in the slight gap, and therefore a contamination and stain are removed from the washing body.

In the above embodiment, though the emitting face 7m of the lens 7j buried in the expanded portion 7b of the rod horn 7 is formed by an obtuse angle, the emitting face may be formed by a circular arc.

Figure 11:
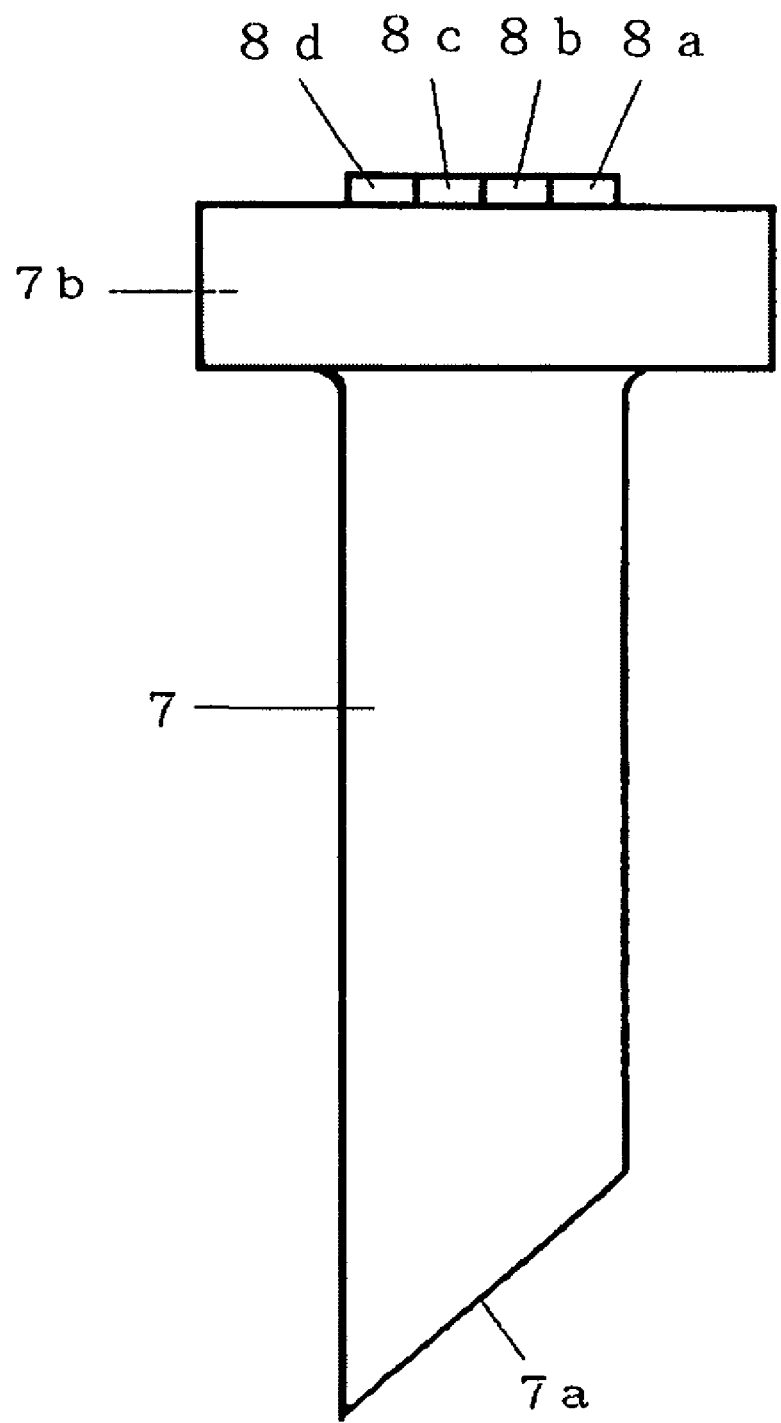
FIG. 11 shows a side view of an ultrasonic washing apparatus according to another embodiment of the present invention.
Figure 12:
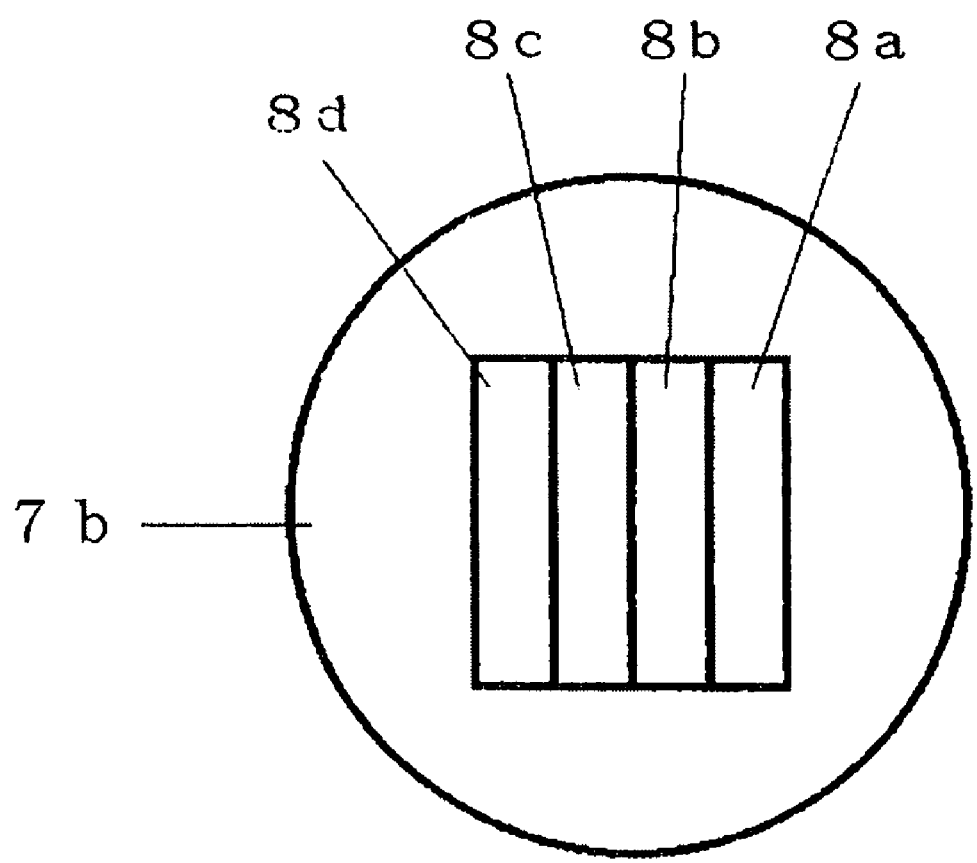
FIG. 12 shows a plan view of ultrasonic vibrator attached to the expanded portion of the rod horn in FIG. 11.

Referring to FIGS. 11 and 12, an expanded portion 7b is formed at one end of the rod horn 7, plural ultrasonic rectangular vibrators 8a, 8b, 8c and 8d are attached to the one end of the expanded portion 7b, and an inclined plane 7a is formed by obliquely cutting one end of the rod horn 7 in the position remote from the focusing point in the rod horn 7.

Figure 13:
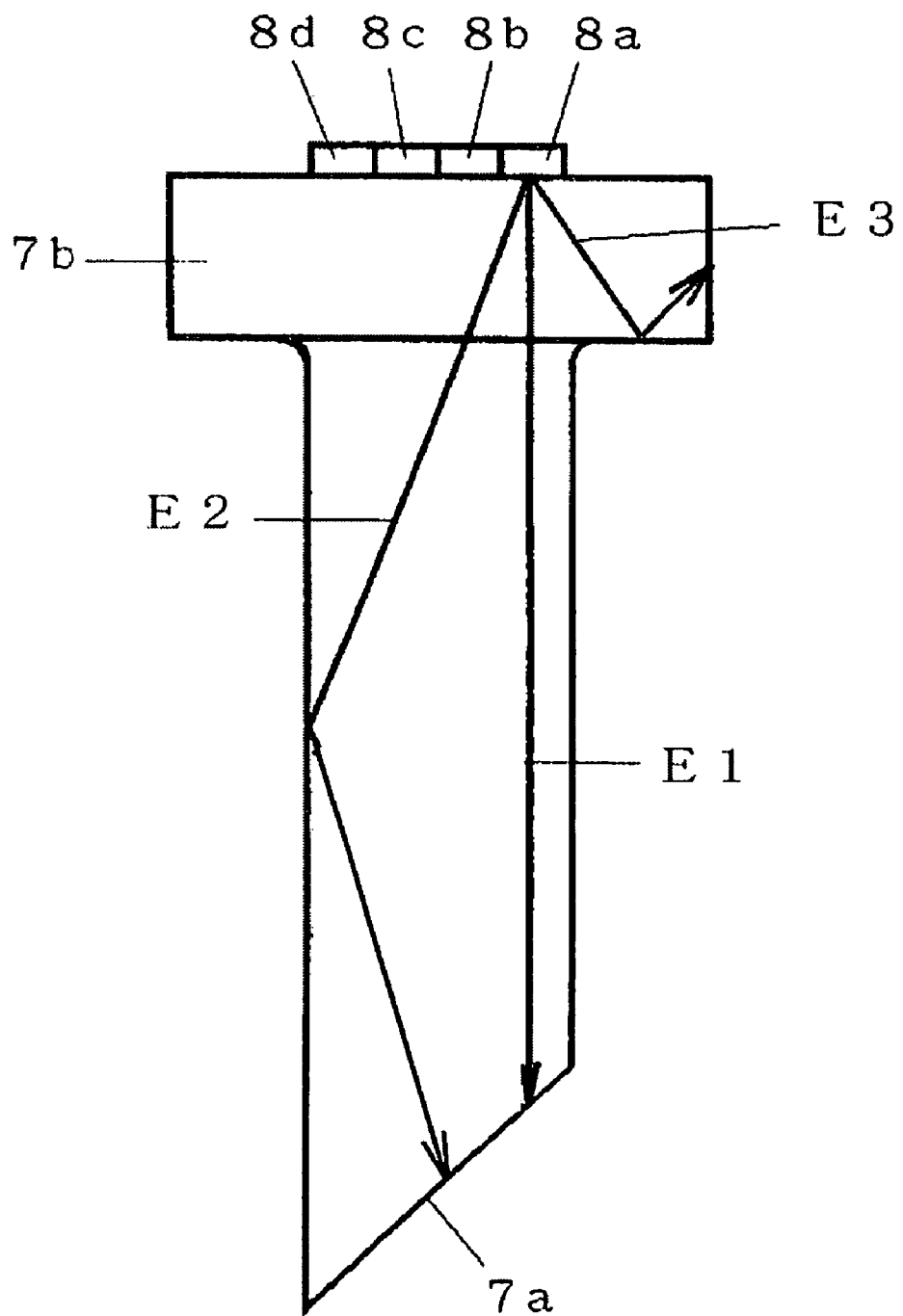
FIG. 13 shows a view of an explanation of a motion of an ultrasonic wave transmitted from one ultrasonic vibrator attached to the rod horn in FIG. 11.

In the above ultrasonic washing apparatus in the embodiment, as shown in FIG. 13, the ultrasonic waves emitted by the ultrasonic vibrator 8a in plural ultrasonic vibrators 8a to 8d are divided by an ultrasonic wave E1 straight emitted from the ultrasonic vibrator 8a to the inclined plane 7a, the ultrasonic wave E2 emitted by the ultrasonic vibrator 8a and reflected by the side of the rod horn 7, and the ultrasonic wave E3 irradiated in the expanded portion and are scattered on the inclined plane.

Figure 14:
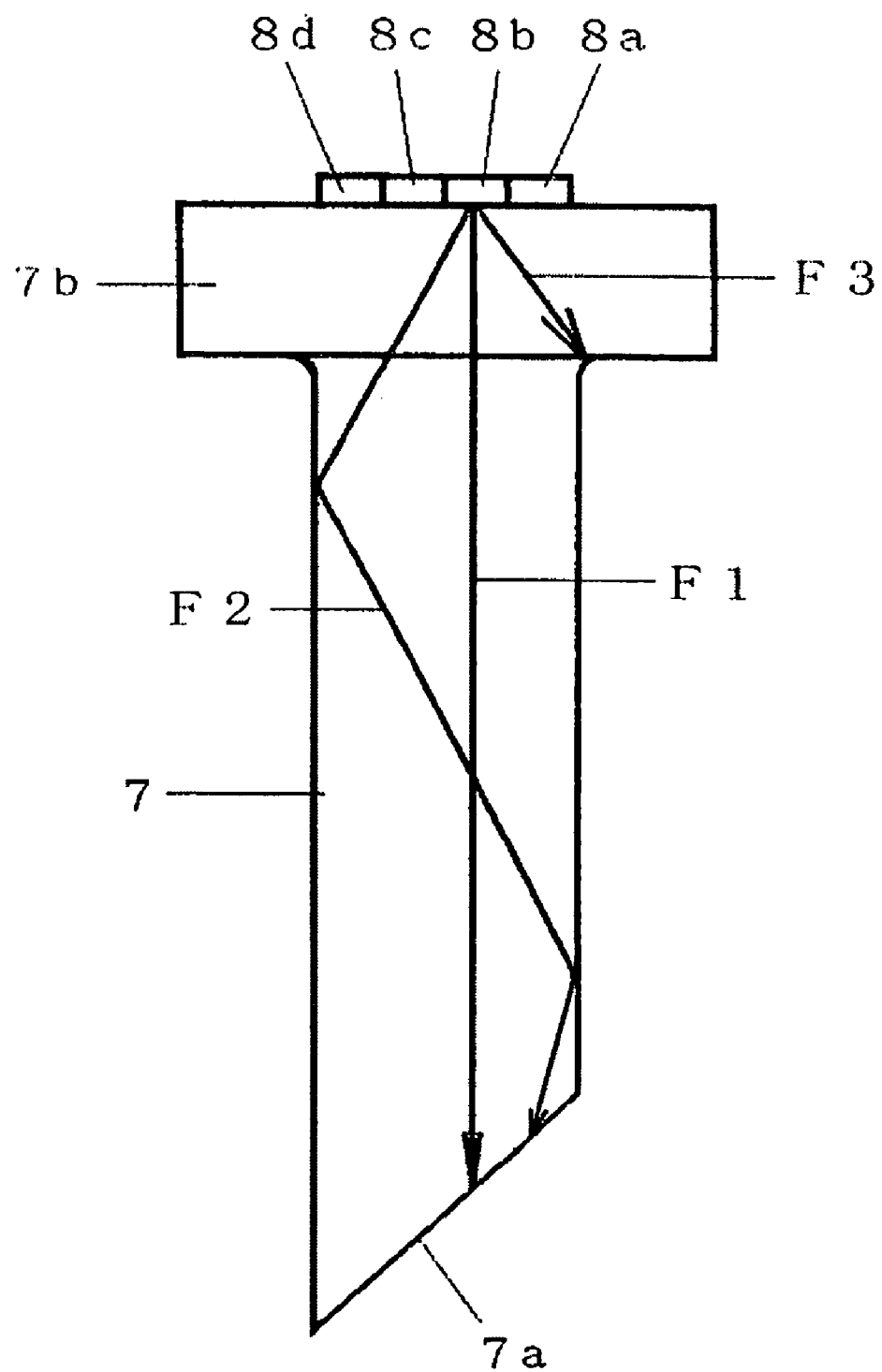
FIG. 14 shows a view of an explanation of a motion of an ultrasonic wave transmitted from another ultrasonic vibrator attached to the rod horn in FIG. 11.

As shown in FIG. 14, the ultrasonic waves emitted from the ultrasonic vibrator 8b are divided into an ultrasonic wave F1 straight irradiated from the ultrasonic vibrator 8 to the inclined plane 7a of the rod horn 7, an ultrasonic wave F2 emitted from the ultrasonic vibrator 8b, reflected by the side of the rod horn 7 and irradiated on the inclined plane 7a, and an ultrasonic wave F3 irradiated in the end of the expanded portion 7b. As a result, the ultrasonic waves irradiated at the center portion of the inclined plane 7a are reduced, uniformity in the inclined plane 7a is improved, and no damage is added to the washing body.

Therefore, in the ultrasonic washing apparatus, the inclined plane 7a is provided opposite to the washing body as a disc in a slight gap between the inclined plane 7a and the washing body. When a washing liquid is flowed in the slight gap and a power from an oscillator (not shown) is applied to the ultrasonic vibrator 8, the ultrasonic waves are transmitted to the inclined plane 7a and are irradiated on the washing body through the washing liquid in the slight gap, and therefore contamination and stain are removed from the washing body.

In the above embodiment, though the plural ultrasonic vibrators 8a to 8d attached to the expanded portion 7b are rectangular, as shown in FIG. 15, plural ultrasonic vibrators 8e, 8f and 8g may be formed by concentric circles.

What is claimed is:

1. An ultrasonic washing apparatus comprising:
   a rod horn for transmitting ultrasonic vibrations, the rod horn extending in a lengthwise direction and having a greatest dimension in said lengthwise direction, said rod horn having a center line extending in the lengthwise direction and the rod horn having an end face for irradiating ultrasonic vibrations at one end and an expanded portion attached to an ultrasonic vibrator at another end, the end face being angled relative to the center line of the rod horn,
   a case for covering the ultrasonic vibrator,
   a point of intersection of the center line of the rod horn and a center point of the end face of the rod horn being in a remote position from a first focusing point of ultrasonic waves emitted from the ultrasonic vibrator transmitted in the rod horn,
   an angle between the center line of the rod horn and the end face being in a range between 100 degrees to 170 degrees,
   a cable connected to the ultrasonic vibrator and drawn out from an end of the case,
   the end face of the rod horn being provided in parallel with a disk to be washed, and in a minute gap between the end face of the rod horn and the disk to be washed, washing liquid is applied from a side of the end face of the rod horn to the gap between the end face and the disk to be washed, and a surface of the disk is washed by the washing liquid and the ultrasonic waves.

2. An ultrasonic washing apparatus as set forth in claim 1 wherein the rod horn is formed by quartz.

3. An ultrasonic washing apparatus as set forth in claim 1 wherein the rod horn includes a constricted part formed at a position remote from a focusing point of the ultrasonic waves from the ultrasonic vibrator in the rod horn.

4. An ultrasonic washing apparatus as set forth in claim 1 wherein the rod horn gradually increases in thickness in the expanded portion attached to the ultrasonic vibrator and the end face is at a position of greatest thickness thereof.

5. An ultrasonic washing apparatus as set forth in claim 1 wherein a hollow portion is formed in a center line between the expanded portion and the end face of the rod horn.

6. An ultrasonic washing apparatus as set forth in claim 5 wherein the hollow portion is a sphere.

7. An ultrasonic washing apparatus as set forth in claim 5 wherein the hollow portion is an oval.

8. An ultrasonic washing apparatus as set forth in claim 1 wherein a lens is buried in the expanded portion.

9. An ultrasonic washing apparatus as set forth in claim 8 wherein the lens is formed by a low expansion ceramics material.

10. An ultrasonic washing apparatus as set forth in claim 1 wherein plural ultrasonic vibrators are attached to the expanded portion.

11. An ultrasonic washing apparatus as set forth in claim 10 wherein plural ultrasonic vibrators are rectangular boards.

12. An ultrasonic washing apparatus as set forth in claim 10 wherein plural ultrasonic vibrators are formed as concentric circles.

* * * * *